(12) United States Patent  (10) Patent No.: US 11,600,754 B2
Yew et al.  (45) Date of Patent: Mar. 7, 2023

(54) LIGHT-EMITTING DEVICE AND METHOD OF PACKAGING THE SAME

(71) Applicant: Lumileds LLC, San Jose, CA (US)

(72) Inventors: Hua Sin Yew, Penang (MY); Hui Ling Pan, Shanghai (CN); Xinping Yan, Shanghai (CN)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/694,735

(22) Filed: Nov. 25, 2019

(65) Prior Publication Data

US 2020/0161521 A1  May 21, 2020

(30) Foreign Application Priority Data

Nov. 29, 2018 (CN) .................. PCT/CN2018/118103
Dec. 21, 2018 (EP) ..................................... 18215443

(51) Int. Cl.
   *H01L 33/54* (2010.01)
   *H01L 33/62* (2010.01)
   *H01L 33/00* (2010.01)
   *H01L 33/56* (2010.01)

(52) U.S. Cl.
   CPC .......... *H01L 33/62* (2013.01); *H01L 33/0095* (2013.01); *H01L 33/56* (2013.01); *H01L 2933/005* (2013.01); *H01L 2933/0066* (2013.01)

(58) Field of Classification Search
   CPC ..... H01L 33/62; H01L 33/0095; H01L 33/56; H01L 33/54; H01L 2933/005; H01L 2933/0066; H01L 33/58; H01L 33/59
   See application file for complete search history.

(56) References Cited

U.S. PATENT DOCUMENTS

| 6,710,377 | B2 | 3/2004 | Shimomura |
| 8,338,845 | B2 | 12/2012 | Watari et al. |
| 2002/0145152 | A1 | 10/2002 | Shimomura |
| 2005/0063033 | A1* | 3/2005 | Kinsman ........... H01L 27/14683 359/245 |

(Continued)

FOREIGN PATENT DOCUMENTS

| CN | 1380704 A | 11/2002 |
| CN | 102142506 A | 8/2011 |
| EP | 1249875 A2 | 10/2002 |

OTHER PUBLICATIONS

EP Application No. 18215443.5, "Extended EP Search Report and Written Opinion," 7 pages.

(Continued)

*Primary Examiner* — Caridad Everhart

(57) ABSTRACT

A light-emitting device (100A) includes: a lead frame (110) including a die paddle (111) and a lead (112) spaced apart from each other; a light-emitting die (120) attached on the die paddle (111); a wire (130) bonding the light-emitting die (120) to the lead (112), wherein a first end (131) of the wire (130) and a region of the light-emitting die (120) to which the first end (131) of the wire (130) is bonded form a first necking area (141); a first resin cover (150a) covering the first necking area (141); and a second resin cover (160) covering the first resin cover (150a), the light-emitting die (120), and the wire (130). The first resin cover (150a) has a hardness lower than a hardness of the second resin cover (160).

19 Claims, 2 Drawing Sheets

(56) References Cited

U.S. PATENT DOCUMENTS

| | | | | |
|---|---|---|---|---|
| 2006/0043407 A1* | 3/2006 | Okazaki | ............... | H01L 33/60 257/100 |
| 2006/0279619 A1* | 12/2006 | Anderson | ............ | H05K 3/4664 347/95 |
| 2007/0215896 A1* | 9/2007 | Sun | ............... | B29C 39/26 257/99 |
| 2007/0287208 A1* | 12/2007 | Thompson | ............ | C08L 83/04 438/26 |
| 2008/0023711 A1* | 1/2008 | Tarsa | ............... | H01L 33/486 257/E33.073 |
| 2008/0191232 A1* | 8/2008 | Lee | ............... | H01L 33/58 257/98 |
| 2009/0108282 A1* | 4/2009 | Matsuda | ............ | H01L 33/508 257/98 |
| 2010/0244282 A1* | 9/2010 | Silverbrook | ............ | H01L 21/56 257/784 |
| 2011/0140143 A1* | 6/2011 | Kim | ............... | H01L 33/642 257/98 |
| 2011/0186886 A1 | 8/2011 | Watari et al. | | |
| 2014/0042467 A1* | 2/2014 | Livesay | ............... | H01L 33/642 257/88 |
| 2015/0021640 A1* | 1/2015 | Oka | ............... | H01L 24/48 257/98 |
| 2016/0244625 A1* | 8/2016 | Clapp | ............... | C08F 283/124 |
| 2019/0103529 A1* | 4/2019 | Kogure | ............... | H01L 33/44 |
| 2020/0032062 A1* | 1/2020 | Wallin | ............... | B33Y 10/00 |

OTHER PUBLICATIONS

From the EPO as the ISA, "Notification of Transmittal of the International Search Report and the Written Opinion of the International Searching Authorityor the Declaration", PCT/EP2019/081365, dated Jan. 15, 2020, 11 pages.

\* cited by examiner

LIGHT-EMITTING DEVICE AND METHOD OF PACKAGING THE SAME

CROSS REFERENCE TO RELATED APPLICATIONS

This application claims priority to International Application No. PCT/CN2018/118103 filed on Nov. 29, 2018 titled "LIGHT-EMITTING DEVICE AND METHOD OF PACKAGING THE SAME," and claims priority to European Patent Application No. 18215443.5 filed on Dec. 21, 2018, and titled "LIGHT-EMITTING DEVICE AND METHOD OF PACKAGING THE SAME." International Application No. PCT/CN2018/118103 and European Patent Application No 18215443.5 are incorporated herein by reference.

FIELD OF THE INVENTION

The invention relates to a wire-bonded product, and in particular to a light-emitting device and a method of packaging such a light-emitting device.

BACKGROUND

Wire bonding is common in the electronic industry to provide a chip with an electrical connection to an outer circuitry. Commonly, a thin wire connects between the electronic chip and a metal lead frame to make the electrical connection.

For optical equipment, such as a light-emitting diode, normally a clear resin without any filler is used to package the chip due to its efficiency in light transmittance. However, the clear resin such as epoxy without fillers becomes hard and brittle after being cured. When the packaged chip is exposed to thermal attacks, the coefficient of thermal expansion (CTE) difference between the metal and the resin will cause pull/push stress onto the bonded wire. This impact becomes higher when the optics resin becomes harder.

U.S. Pat. No. 6,710,377 B2 discloses a light-emitting device including a semiconductor light-emitting element and a silicone resin provided to embed the semiconductor light-emitting element. The use of a silicone resin as the resin for sealing the semiconductor light-emitting elements instead of conventional epoxy resins can reduce the possibility of breakage of the wire.

SUMMARY

In spite of the capability of resisting to wire breakage in the existing devices, there is still a need for a light-emitting device with improved optical properties and/or mechanical strength.

According to an aspect of the invention, there is provided a light-emitting device comprising: a lead frame comprising a die paddle and a lead spaced apart from each other; a light-emitting die attached on the die paddle; a wire bonding the light-emitting die to the lead, wherein a first end of the wire and a region of the light-emitting die to which the first end of the wire is bonded form a first necking area; a first resin cover covering the first necking area; and a second resin cover covering the first resin cover, the light-emitting die, and the wire, wherein the first resin cover has a hardness lower than a hardness of the second resin cover.

By covering only the necking area instead of the whole die and the wire using the first resin, it is expected to improve the optical properties of the device while still providing desired mechanical strength. On one hand, the first (softer) resin such as silicone will provide buffer for mechanical deformation during the thermal attack, thus protecting the wire from harsh stress that easily leads to breakage. The mechanical strength may be even improved in the sense that a smaller stress will be produced due to a smaller interface between the first (softer) resin and the second (harder) resin as compared to the case where the soft resin covers the whole die and the wire and the hard resin then covers the soft resin. On the other hand, covering only the necking area with the first softer resin means that most of the light emitting area of the die remains uncovered by the soft resin. By this, most of the light leaving the light-emitting die directly enters the second resin without having first to pass the first resin. Such has at least two advantages: 1) with the hard resin generally having superior optical properties over the soft resin, in particular a better transparency, less light is absorbed; and 2) with diminishing the boundary between soft and hard resins less light has to pass such boundary and losses by absorption and refraction on such passing are reduced. As a result, the optical properties of the light-emitting device can be improved, e.g., more light can be coupled out from the light-emitting die.

In some embodiments, a second end of the wire and a region of the lead to which the second end of the wire is bonded form a second necking area. In this case, the light-emitting device may further comprise an additional first resin cover which covers the second necking area, and the second resin cover may further cover the additional first resin cover. This provides improved reliability by reducing the risk of breakage at the second end of the wire.

In some embodiments, the first resin cover(s) is/are made of a silicone resin. In some embodiments, the silicone resin has a dynamic viscosity in a range of 1 to 8 Pa·s before cured. Preferably, the silicone resin can cure under room temperature. In some embodiments, the first resin after cured may have a hardness in a range of 30 A to 70 D (measured as indentation hardness on the durometer in Shore hardness scales A and D).

In some embodiments, the second resin cover is made of an epoxy resin. The term epoxy as used herein is a colloquial name for the epoxide functional group. Epoxy resins, also known as polyepoxides, are a class of reactive prepolymers and polymers which contain epoxide groups.

In some embodiments, the light-emitting die is a light-emitting diode (LED) die. As used herein for purposes of the present invention, the term "LED" should be understood to include any electroluminescent diode or other type of carrier injection/injunction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like. In particular, the term LED refers to light-emitting diodes of all types (including semiconductor and organic light-emitting diodes) that may be configured to generate radiation in one or more of the infrared spectrum, ultraviolet spectrum, and various portions of the visible spectrum (generally including radiation wavelengths from approximately 400 nanometers to approximately 700 nanometers).

According to another aspect of the invention, there is provided a method of packaging a light-emitting device. The light-emitting device comprises a lead frame and a light-emitting die, the lead frame comprising a die paddle and a lead spaced apart from each other, the light-emitting die being attached on the die paddle. The method comprises: bonding the light-emitting die to the lead with a wire, wherein a first end of the wire and a region of the light-emitting die to which the first end of the wire is bonded form a first necking area; covering the first necking area with a first resin cover; and forming a second resin cover to seal the first resin cover, the light-emitting die, and the wire, wherein the first resin cover has a hardness lower than a hardness of the second resin cover.

These and other aspects of the present invention will be apparent from and elucidated with reference to the embodiment(s) described hereinafter.

BRIEF DESCRIPTION OF THE DRAWINGS

Further details, features and advantages of the invention are disclosed in the following description of exemplary embodiments in connection with the accompanying drawings, in which.

The drawings are not necessarily drawn to scale. Like reference signs refer to like elements throughout.

DETAILED DESCRIPTION

Figure 1:
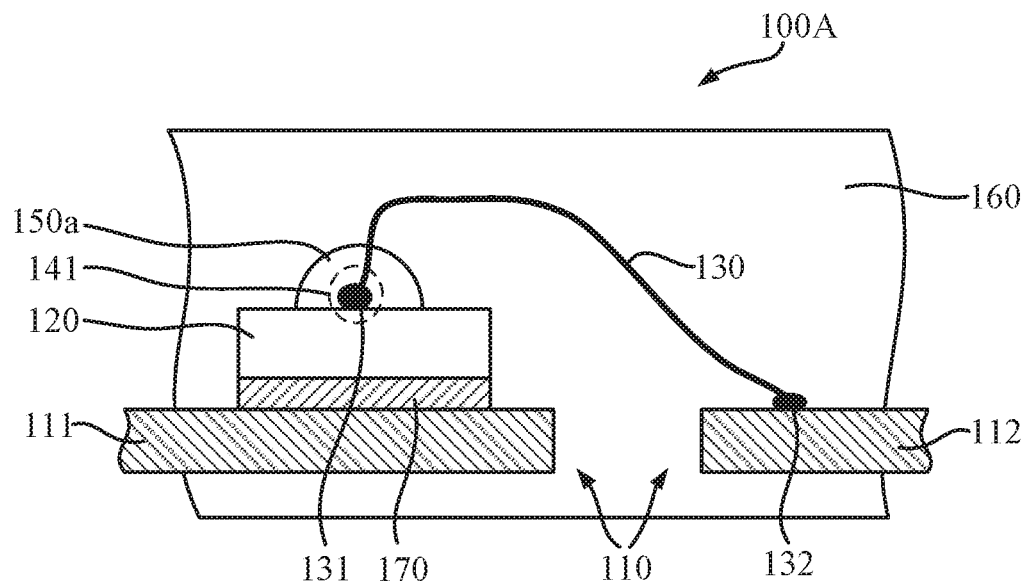
FIG. 1 is a schematic cross-sectional view of a light-emitting device according to an embodiment of the present invention.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 shows a schematic cross-sectional view of a light-emitting device 100A according to an embodiment of the present invention.

The light-emitting device 100A includes a lead frame 110, a light-emitting die 120, a wire 130, a first resin cover 150a, and a second resin cover 160.

The lead frame 110 includes a die paddle 111 on which the light-emitting die 120 is attached, and a lead 112 spaced apart from the die paddle 111. The die paddle 111 provides mechanical support and additionally heat dissipation for the light-emitting die 120. The lead 112, besides possible further leads, allows the light-emitting die 120 to have an access to an outside circuitry, for example, a power supply.

The light-emitting die 120 is attached by an adhesive 170 such as silver (Ag) paste onto the die paddle 111. The light-emitting die 120 such as an LED die may have an electrode (not shown) on its surface, which is connected with the lead 112 by the bonding wire 130 such as a gold (Au) wire, with a first end 131 of the wire 130 being connected to the electrode of the light-emitting die 120 and a second end 132 of the wire 130 being connected to the lead 112.

As shown in FIG. 1, the first end 131 of the wire 130 and a region of the light-emitting die 120 to which the first end 131 of the wire 130 is bonded form a first necking area 141, which, in practice, is especially prone to breakage due to the CTE difference between the metal electrode and the sealing resin. In this embodiment, a first resin cover 150a is provided to cover the first necking area 141, and a second resin cover 160 is provided to cover the first resin cover 150a, the light-emitting die 120, and the wire 130. The first resin cover 150a is made of, for example, a silicone resin and is softer than the second resin cover 160. In some embodiments, the first resin cover 150a has a hardness in the range of 30A to 70D (measured as indentation hardness on the durometer in Shore hardness scales A and D), and the second resin cover 160 has a hardness higher than that of the first resin cover 150a. Thus, the first resin cover 150a can provide buffer for mechanical deformation during thermal attacks. The second resin cover 160 is made of, for example, an epoxy resin and hence provides superior optical properties (e.g., a higher transmissivity) than the first resin cover 150a. Advantageously, the configuration of the first and second resin covers 150a, 160 provides a tradeoff between the mechanical strength and the optical properties.

Figure 2:
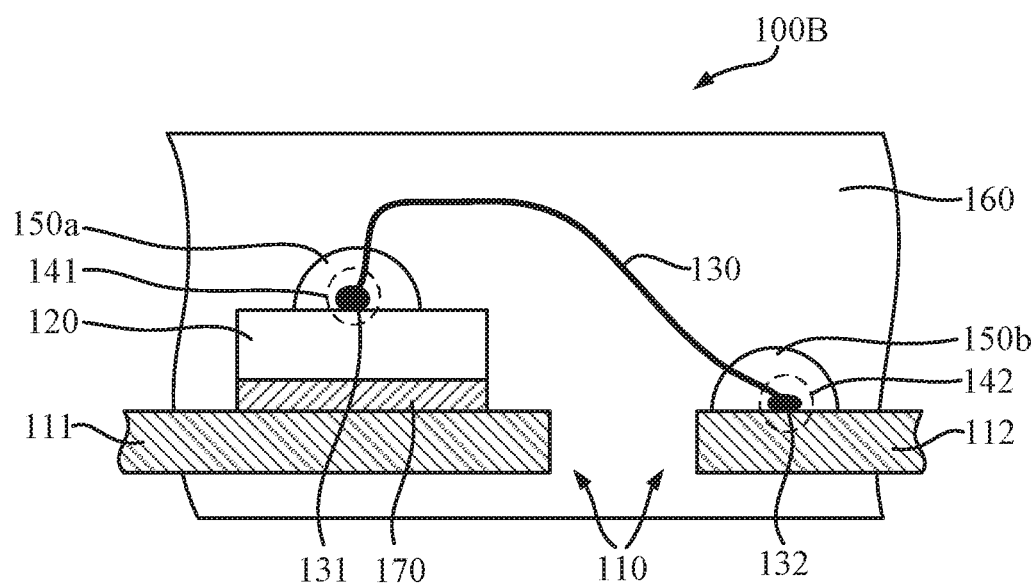
FIG. 2 is a schematic cross-sectional view of a light-emitting device according to another embodiment of the present invention.

FIG. 2 shows a schematic cross-sectional view of a light-emitting device 100B according to another embodiment of the present invention. The same configuration as that of the light-emitting device 100A described above with respect to FIG. 1 is not repeated here for conciseness.

As shown in FIG. 2, the second end 132 of the wire 130 and a region of the lead 112 to which the second end 132 of the wire 130 is bonded form a second necking area 142, which also tends to suffer breakage due to the CTE difference between the metal lead 112 and the sealing resin 160. In this embodiment, an additional first resin cover 150b, made of the same silicone resin as the first resin cover 150a for example, is provided to cover the second necking area 142, and the second resin cover 160 further covers the additional first resin cover 150b accordingly. This further reduces the risk of breakage at the second end 132 of the wire 130, thus resulting in an improved reliability of the light-emitting device 100B.

Figure 3:
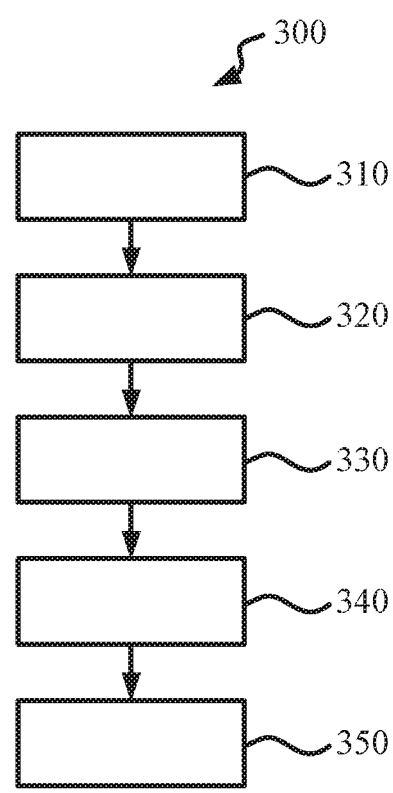
FIG. 3 is a flow chart showing a method of packaging a light-emitting device according to an embodiment of the present invention.

FIG. 3 is a flow chart showing a method 300 of packaging a light-emitting device according to an embodiment of the present invention. The method 300 can be used to package the light-emitting device 100A and/or the light-emitting device 100B and is described below with further reference to FIGS. 1 and 2.

At step 310, the light-emitting die 120 is attached to the die paddle 111 of the lead frame 110. Specifically, the die paddle 111 is applied with an adhesive 170 such as silver (Ag) paste and the die 120 is then bonded on the die paddle 111 by means of the silver paste.

At step 320, the silver paste is cured. This can be done for example in a nitrogen ($N_2$) atmosphere at 175° C. for an hour.

At step 330, the light-emitting die 120 is wire-bonded to the lead 112 with the wire 130. This can be done by a typical wire-bonding process used in the integrated circuit industry. As a result, the first necking area 141 is formed by the first end 131 of the wire 130 and a region of the light-emitting die 120 to which the first end 131 of the wire 130 is bonded, and a second necking area 142 is formed by the second end 132 of the wire 130 and a region of the lead 112 to which the second end 132 of the wire 130 is bonded.

At step 340, the first necking area 141 is covered with a first resin cover 150a. Specifically, a small amount of the first resin such as a silicone resin is dispensed at the first necking area 141 using a dispenser, for example, a needle. The silicone resin may have a dynamic viscosity in the range of, for example, 1 to 8 Pa·s (Pa·s means "Pascal multiplied with seconds") before cured. The amount of the resin dispensed can be controlled by the dispenser such that the resin stays at the location where it was dispensed, forming a hemisphere-like shape without spreading out to smear the whole surface of the light-emitting die 120. In some embodiments, the second necking area 142 is also covered with the first resin cover 150b. This can be done in the same way as the formation of the first resin cover 150a. Then, the first resin dispensed at the first necking area 141 (and potentially the second necking area 142) is cured by a suitable curing process, for example, moistening or heating. In some embodiments, the first resin may be cured by baking in an oven first at 80° C. for two hours and then at 150° C. for three hours. Preferably, the first resin can be chosen such that it can cure under room temperature. Other embodiments are possible as long as the light-emitting die 120 can withstand the curing process used. In some embodiments, the first resin after cured may have a hardness in the range of 30 A to 70 D (measured as indentation hardness on the durometer in Shore hardness scales A and D).

At step 350, the second resin cover 160 is formed to seal the first resin cover 150a, the light-emitting die 120, and the wire 130. In embodiments where the first resin cover 150b is formed at the second necking area 142, the second resin cover 160 is formed such that it also seals the first resin cover 150b. Step 350 can be done by a typical hard resin shape forming process, for example, molding or casting. As shown in FIGS. 1 and 2, the second resin cover 160 wraps around the light-emitting die 120 and the wire 130 (including the first resin covers 150a, 150b).

In embodiments, after step 350, the resultant light-emitting device may be further processed with subsequent processes, such as post-mold-curing (PMC), de-flashing, plating, annealing, etc., which are not described here in detail so as not to obscure the subject matter of the invention.

Variations to the disclosed embodiments can be understood and effected by the skilled person in practicing the claimed invention, from a study of the drawings, the disclosure, and the appended claims. The mere fact that certain measures are recited in mutually different dependent claims does not indicate that a combination of these measures cannot be used to advantage.

LIST OF REFERENCE SIGNS 100A, 100B inventive light emitting devices
110 lead frame
111 die paddle
112 lead
120 light-emitting die
130 wire
131 first wire end
132 second wire end
141 first necking area
142 second necking area
150a first resin cover
150b an additional first resin cover
160 second resin cover
170 adhesive
300 method of packaging an inventive light-emitting device
310 step of attaching light-emitting die 120 to die paddle 111
320 step of curing adhesive 170
330 step of wire-bonding
340 step of covering first necking area with first resin cover
350 step of forming second resin cover 160

The invention claimed is:
1. A light-emitting device comprising:
a lead frame including a die paddle and a lead spaced apart from each other;

a light-emitting die attached on the die paddle;

a wire connecting the light-emitting die to the lead, a first end of the wire and a region of the light-emitting die to which the first end of the wire is bonded forming a first necking area, a second end of the wire and a region of the lead to which the second end of the wire is bonded forming a second necking area;

a first resin cover covering only the first necking area of the wire and the light-emitting die while leaving a majority of a light emitting area of the light-emitting die free of the first resin cover; and a second resin cover directly covering the first resin cover, the majority of the light emitting area of the light-emitting die that is free of the first resin cover, and the wire, the first resin cover having a hardness lower than a hardness of the second resin cover.

2. The light-emitting device of claim 1, the first resin cover including a silicone resin.

3. The light-emitting device of claim 2, the silicone resin having a dynamic viscosity in a range of 1 to 8 Pa·s when uncured.

4. The light-emitting device of claim 2, the silicone resin having a hardness of 30 A to 70 D in Shore hardness scales when cured.

5. The light-emitting device of claim 1, the second resin cover including an epoxy resin.

6. The light-emitting device of claim 1, the light-emitting die comprising a light-emitting diode die.

7. The light-emitting device of claim 1, the first resin cover having a transmissivity lower than a transmissivity of the second resin cover.

8. A method for packaging a light-emitting device, the light-emitting device comprising a lead frame and a light-emitting die, the lead frame comprising a die paddle and a lead spaced apart from each other, the light-emitting die being attached on the die paddle, the method comprising:

connecting the light-emitting die to the lead with a wire, a first end of the wire and a region of the light-emitting die to which the first end of the wire is bonded forming a first necking area, a second end of the wire and a region of the lead to which the second end of the wire is bonded forming a second necking area;

covering only the first necking area of the wire and the light-emitting die with a first resin cover while leaving a majority of a light emitting area of the light-emitting die free of the first resin cover; and forming a second resin cover directly on and to seal the first resin cover, the majority of the light emitting area of the light-emitting die that is free of the first resin cover, and the wire, the first resin cover having a hardness lower than a hardness of the second resin cover.

9. The method of claim 8, the covering of the first necking area comprising dispensing a silicone resin at the first necking area.

10. The method of claim 9, the silicone resin being uncured during the dispensing and having a dynamic viscosity in a range of 1 to 8 Pa·s when uncured.

11. The method of claim 9, further comprising curing the silicone resin after the dispensing.

12. The method of claim 11, the silicone resin having a hardness of 30 A to 70 D in Shore hardness scales after the curing.

13. The method of claim 8, the forming of the second resin cover comprising molding or casting an epoxy resin on the first resin cover, the light-emitting die, and the wire.

14. The method of claim 8, the light-emitting die comprising a light-emitting diode die.

15. The method of claim 8, the first resin cover having a transmissivity lower than a transmissivity of the second resin cover.

16. The method of claim 8, further comprising covering only the second necking area of the wire and the lead with an additional first resin cover that is separated from the first resin cover, the additional first resin cover having a hardness lower than a hardness of the second resin cover, the second resin cover being formed directly on and to seal the additional first resin cover.

17. The method of claim 8, the first resin cover being arranged so as to relieve stress on the first end of the wire and the first necking area.

18. The light-emitting device of claim 1, further comprising an additional first resin cover, separated from the first resin cover, covering only the second necking area of the wire and the lead, the additional first resin cover having a hardness lower than a hardness of the second resin cover, the second resin cover directly covering the additional first resin cover.

19. The light-emitting device of claim 1, the first resin cover being arranged so as to relieve stress on the first end of the wire and the first necking area.

\* \* \* \* \*